United States Patent [19]

Queyssac et al.

[11] Patent Number: 5,089,877
[45] Date of Patent: Feb. 18, 1992

[54] ZERO POWER IC MODULE

[75] Inventors: Daniel Queyssac, Dallas; Richard K. Robinson, Weston; Kimi S. Husse, Keller, all of Tex.

[73] Assignee: SGS-Thomson Microelectronics, Inc., Carrollton, Tex.

[21] Appl. No.: 534,151

[22] Filed: Jun. 6, 1990

[51] Int. Cl.$^5$ .............. H01L 23/48; H01L 23/02; H05K 5/00; H05K 5/06
[52] U.S. Cl. .................. 357/70; 357/74; 357/75; 361/380; 361/394; 174/52.4
[58] Field of Search ............ 357/70, 80, 74, 75; 365/228, 226, 229; 361/394, 380; 174/52.4

[56] References Cited

U.S. PATENT DOCUMENTS

| | | | |
|---|---|---|---|
| 4,142,287 | 3/1979 | Grabbe | 357/74 |
| 4,539,660 | 9/1985 | Miyauchi et al. | 365/229 |
| 4,616,655 | 10/1986 | Weinberg et al. | 357/80 |

Primary Examiner—Andrew J. James
Assistant Examiner—Carl Whitehead, Jr.
Attorney, Agent, or Firm—Richard K. Robinson; Lisa K. Jorgenson; Dennis T. Griggs

[57] ABSTRACT

An integrated circuit package encapsulates a volatile memory chip and a backup battery for preserving data in the event of loss of main power supply. The package includes a finger lead assembly encapsulated within a body of non-conductive material, with a central base support finger lead being offset within an interconnect region. One terminal of the battery is welded to the offset base finger lead, and the integrated circuit chip is bonded directly onto the other battery terminals by a layer of conductive epoxy. The stacked assembly of the integrated circuit chip, the battery and the offset base finger lead is centered longitudinally and vertically within the interconnect region whereby the stacked assembly, including gold interconnect wires, are completely encapsulated within the molded package body, without increasing the standoff height of the package.

10 Claims, 5 Drawing Sheets

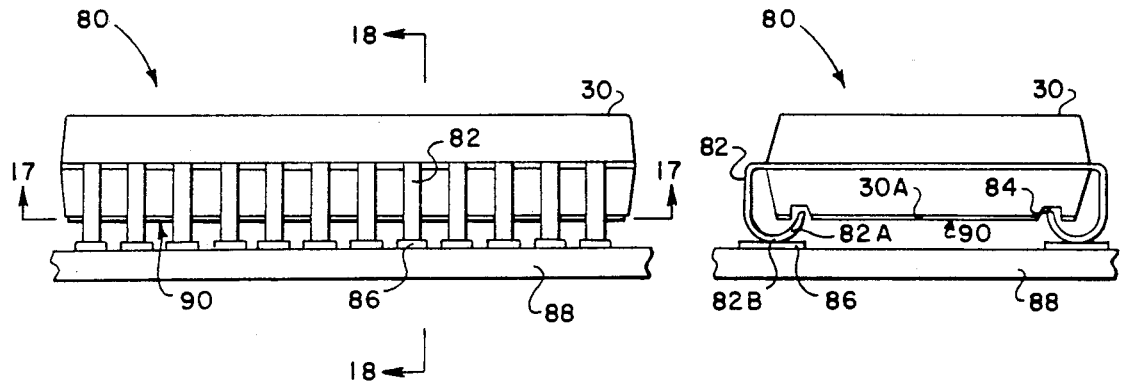
FIG. 15
FIG. 16
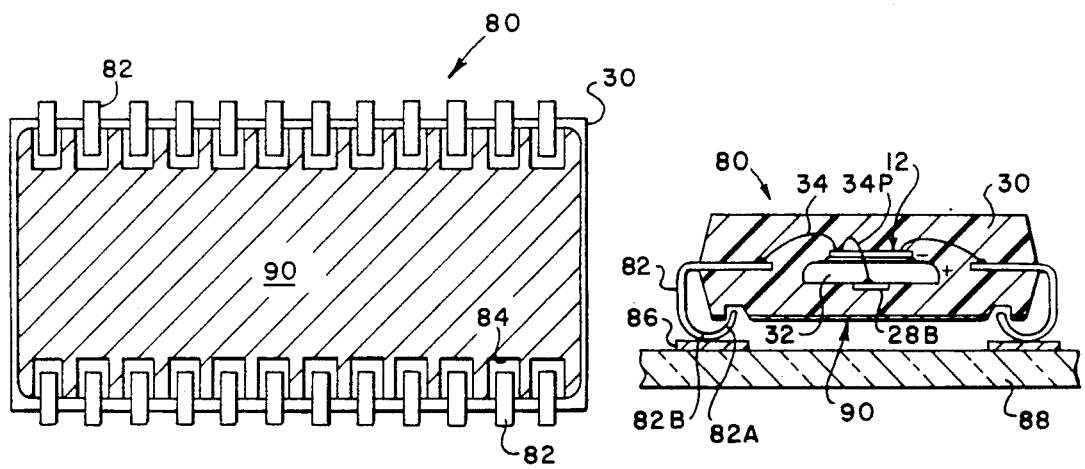
FIG. 17
FIG. 18

ZERO POWER IC MODULE

This application contains subject matter related to copending U.S. application Ser. No. 07/534,150, titled ZERO POWER IC MODULE, filed June 6, 1990, now allowed. Both of these applications have been assigned to the same assignee, SGS-Thomson Microelectronics, Inc.

FIELD OF THE INVENTION

This invention relates generally to packaging for semiconductor devices, and in particular to an integrated circuit package for encapsulating a semiconductor integrated circuit such as a memory chip and a backup battery for preserving memory data upon loss of main power supply.

BACKGROUND OF THE INVENTION

Conventional electronic circuit packages for semiconductor integrated circuit chips are adapted to enclose and seal the chip devices, while also providing heat dissipation, structural support, electrical attachment of device leads to external pin connectors, and electrical interconnection with other devices in the package. Such packages may be formed of one or more layers of a non-conductive material, with the semiconductor chip embedded within one of the layers. Flexible metal leads are extended from an interconnect region surrounding the chip to edge mounted connector pins for connecting the device input/output terminals to a printed circuit board socket in a host electronic circuit.

An important integrated circuit product which is implemented on an IC chip encapsulated within an integrated circuit package includes a volatile semiconductor memory such as the static random access memory (SRAM) which is characterized by low power consumption and high memory cell density. The generation of valid logic signals and the retention of data in such integrated memory circuits having volatile memory cells depend in part on maintenance of power supply voltages within specified limits. In conventional integrated circuit memory devices, internal circuits sense the external source voltage being applied to determine if it is sufficient for reliable operation. In response to a low voltage condition, control signals are generated which cause active chips to be de-selected and maintained in standby condition. This is usually carried out by means of true and complement chip select signals, CS and CS, respectively, which inhibit read/write operations until the low voltage condition has been corrected.

During the period that a memory chip is in the unselected condition it is necessary to maintain the charge levels of the storage capacitors in the volatile memory cells so that stored data will be retained. Otherwise, the information stored in the memory cells, including programs and data, will be lost when main power is removed. Although the loss of power does not result in memory circuit damage, the loss of stored information requires that the memory be reloaded with programs and data before processing can be reestablished.

DESCRIPTION OF THE PRIOR ART

It has been proposed to solve the data loss problem by using an additional pin terminal on memory semiconductor circuits and that the additional terminal will be supplied with backup power from a remote source to maintain the data in the memory cells. However, there are now established standardized pin patterns for most integrated circuit memories; consequently, the addition of another pin dedicated to a remote backup power supply would not be compatible with standard pin patterns, and would require a substantial redesign of existing circuits Accordingly, there exists a need for a semiconductor memory package for encapsulating a memory chip and a backup battery wherein the socket area and standard pin configuration are not affected, and stored data are retained despite a loss of the main power supply.

A substantial portion of the cost and size of a packaged chip is attributable to package fabrication, and two important design criteria in addition to providing a reliable electrical connection are cost effectiveness and space efficiency. A need thus exists for an improved device package for safely supporting an integrated circuit chip and a backup battery wherein the package is provided with pin connectors formed therein for plug-in compatibility with standard printed circuit board sockets, and the packaging space required for supporting the backup battery is minimized.

Some packages for integrated circuit memory devices include a battery molded within one half section of a two-part package. In that construction, a chip is loaded onto the base plate of a lead frame and wires are bonded between I/O pads and respective internal leads. The mold is heated, and molding resin is then injected into the heated mold cavity. Consequently, the lead frame and IC chip are encapsulated by the resin within one molded half section. A small battery and other discrete components, for example a crystal, are mounted within a second half section. The second selected half section includes connector pins accurately positioned for engaging finger leads in the lead frame of the first molded half section. The dual section arrangement has served well for many product applications. However, the additional height imposed by the second half section produces a package which exceeds the maximum height limit established for critical space product applications.

Accordingly, a need thus exists for an improved device package in which a semiconductor circuit device, a lead frame assembly and a backup battery are encapsulated within a single molded body of non-conductive material, wherein the packaging height dimension is no greater than the height of conventional device packages which do not include a backup battery.

SUMMARY OF THE INVENTION

The present invention provides an improved package for encapsulating an integrated circuit device, including a backup battery, and it overcomes the foregoing backup battery limitations by mounting the integrated circuit device onto one of the terminals of the backup battery, and by mounting the other battery terminal on a base plate finger lead of a lead frame assembly. In the preferred embodiment, the base plate finger lead is vertically offset in non-coplanar relation with respect to the plane of the lead frame assembly, and one of the battery terminals is conductively bonded to the offset segment. The chip substrate is bonded to the other battery terminal by a layer of conductive adhesive. According to this offset arrangement, the backup battery and IC chip are centered vertically and longitudinally with respect to the lead frame within the molded body of the package, without increasing the height of the package, and without altering the socket area or the pin configuration.

In an alternative embodiment, one terminal of the backup battery is mounted onto the base plate finger lead with a ceramic substrate being mounted onto the other battery terminal. The integrated circuit substrate is bonded onto the ceramic substrate by a layer of nonconductive epoxy, with electrical contact being made to the underlying backup battery terminal by a via conductor. The surface of the ceramic substrate is highly polished to a smooth finish, thereby supporting integrated circuit chips of different sizes for electrical contact to either the positive or negative terminal of a backup battery which may have rough, uneven terminal surfaces.

Operational features and advantages of the present invention will be appreciated by those skilled in the art upon reading the detailed description which follows in connection with the attached drawings, wherein:

BRIEF DESCRIPTION OF THE DRAWINGS

FIG. 15 is a side elevational view of a surface mount, dual-in-line integrated circuit chip package having J-leads soldered onto a landed substrate;

FIG. 16 is a right side elevational view of the surface mount, dual-in-line chip package shown in FIG. 15;

FIG. 17 is a sectional view of the surface mount, dual-in-line chip package taken along the line 17—17 in FIG. 15; and, FIG. 18 is a sectional view of the surface mount, dual-in-line chip package taken along the line 18—18 in FIG. 15.

DETAILED DESCRIPTION OF THE PREFERRED EMBODIMENT

Figure 1:
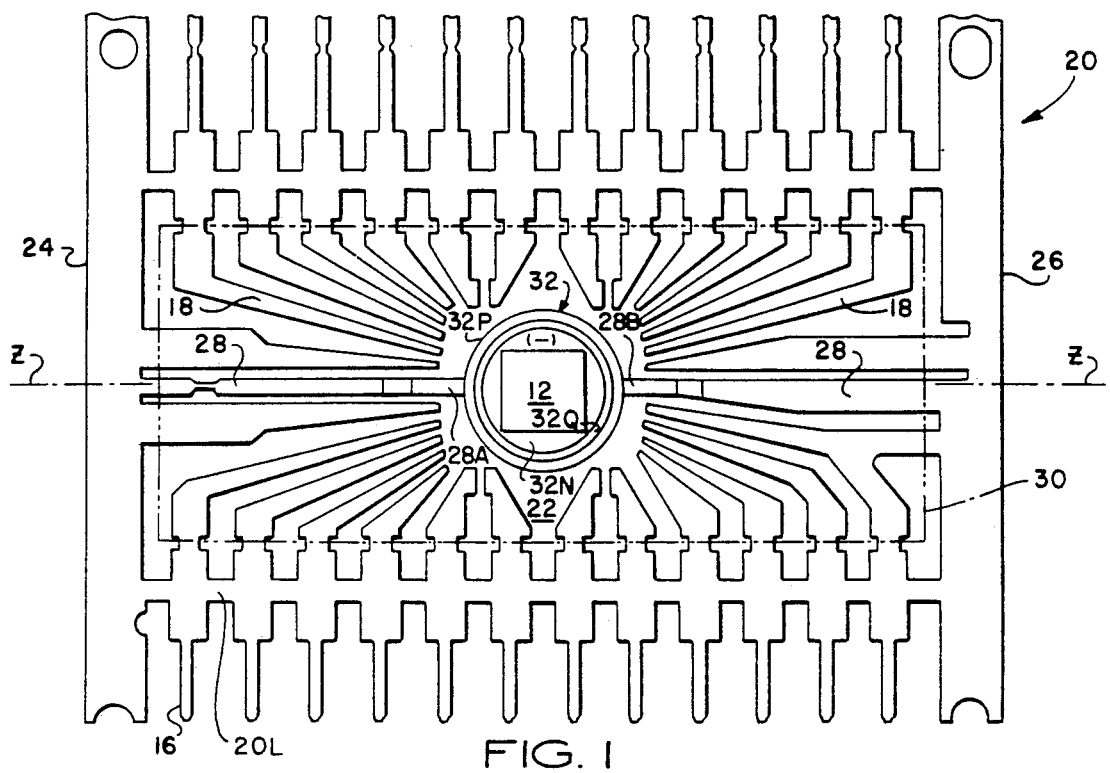
FIG. 1 is a plan view of a lead frame assembly having an integrated circuit chip mounted onto the negative terminal of a backup battery according to a first embodiment of the invention.

In the description which follows, like parts are indicated throughout the specification and drawings with the same reference numerals, respectively. By way of example, the invention is described in combination with a static random access memory (SRAM) which is implemented by monolithic CMOS/LSI techniques on an N-type silicon semiconductor chip. It will be appreciated, however, that the packaging assembly of the invention may be used to encapsulate and provide replaceable backup battery power for discrete as well as integrated devices, but has particular utility for volatile memory integrated circuits having multiple input/output nodes. Accordingly, it should be understood that the invention in its broadest aspects may be incorporated in any moldable package which houses one or more circuit devices requiring backup power, including but not limited to discrete, micro-discrete and integrated circuit components, and hybrid combinations of discrete and integrated devices.

Figure 2:
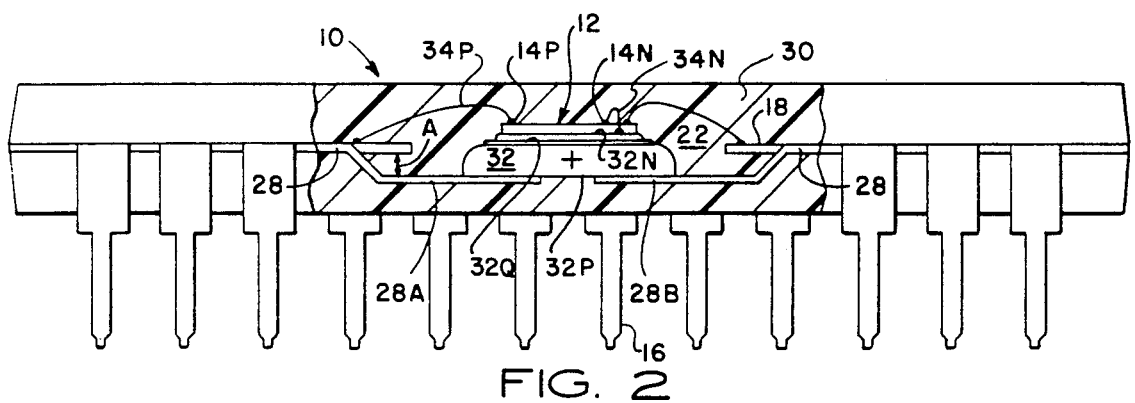
FIG. 2 is a side elevational view, partly in section, of the semiconductor integrated circuit battery and lead frame in a unitary molded package.
Figure 3:
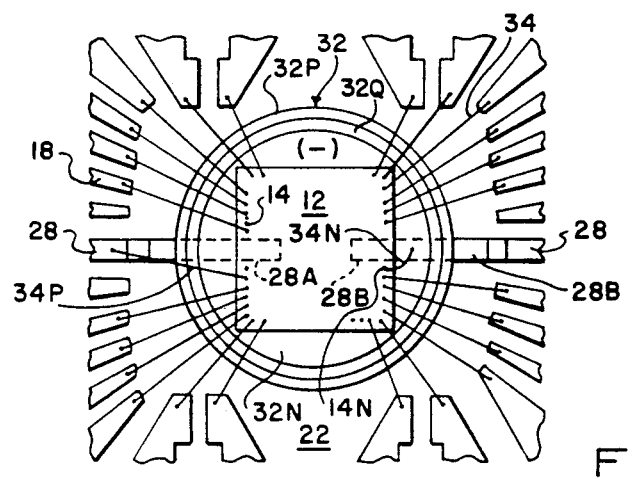
FIG. 3 is a top plan view, partially broken away, of the integrated circuit, backup battery and finger lead assembly of FIG. 2.

Referring now to FIG. 1, FIG. 2 and FIG. 3, there is shown an exemplary semiconductor chip package 10 incorporating the present invention. The package 10 supports and encapsulates an integrated circuit chip 12 having input/output nodes 14. The IC chip 12 may be, for example a 2K×8 static random access memory (SRAM) circuit which is characterized by low power consumption, high memory cell density and which is implemented by complementary metal oxide semiconductor (CMOS) technology.

The exemplary package 10 has a conventional dual-in-line pin configuration including twenty-four external connector pins arranged in two parallel rows with 600 mil spacing along the longitudinal edges of the package. The input/output nodes 14 of the integrated circuit chip 12 are electrically connected to selected connector pins 16 by conductive finger leads 18 of a lead frame assembly 20 as shown in FIG. 1.

Referring to FIG. 1, FIG. 2 and FIG. 3, the inner lead fingers 18 are radially spaced with respect to a central interconnect region 22 and are integrally formed with the connector pins 16. Linking segments 20L of the lead frame assembly 20 are ultimately trimmed away during manufacture, whereby each inner lead 18 is electrically connected to a single connector pin 16. Transport side rail strips 24, 26 on the outer perimeter of the lead frame 20 are also cut away during trim and form operations in the last stages of manufacture, after molding has taken place.

The inner tips of the conductive fingers 18 are symmetrically spaced about the interconnect region 22. The inner tips of the conductive fingers 18 are relatively narrow, and the fingers expand substantially as they radiate outwardly from the interconnect region 22. The lead frame assembly 20 includes a central base support finger lead 28 which extends in alignment with the longitudinal axis Z of the integrated circuit package 10. According to one aspect of the preferred embodiment, the base plate support lead 28 is severed about its midpoint and is then formed in offset relation to the plane of the lead frame assembly 20 as indicated in FIG. 2, thereby producing separated finger lead tie bar segments 28A, 28B. The separated tie bar segments 28A, 28B are offset by a vertical spacing dimension A with respect to the finger leads 18.

The external connector pins 16 and inner finger leads 18 are initially coplanar during molding. After molding, the connector pin portions 16 are bent through a 90 degree angle along the longitudinal side surfaces of the package during the trim and form operation.

The semiconductor chip package 10 provides a standard external pin pattern for electrically connecting the input/output nodes 14 of the semiconductor chip 12 to a socket on a printed circuit board of a host electronic system or on some other semiconductor package. The chip package 10 includes a molded body 30 of non-conductive material, for example a polymer such as polyetherimide or epoxy resin. In this arrangement, the finger lead assembly 20, the semiconductor chip 12 and a backup battery 32 are embedded and encapsulated within the molded body 30.

Preferably, the backup battery 32 is hermetically sealed so that its electrolyte will not evaporate when it is exposed to the elevated temperature conditions of the transfer molding procedure. Additionally, it is preferred that the battery 32 have a non-linear internal impedance which rises to a high resistance value in response to short circuit current flow. This is desirable because the backup battery 32 will be shorted by the lead frame during assembly, during transfer molding, until the lead frame has been trimmed. For some applications, it is desirable that the backup battery 32, in addition to being hermetically sealed and having short circuit protection, is also rechargeable so that its charge level can be restored to its rated value after assembly and trimming have been completed.

In one exemplary embodiment, the battery 32 is a 3.2 volt DC cell having a 12.5 mm diameter. It is essential that the battery 32 be rated for high temperature duty, since it will be exposed to high temperatures during wire bonding and transfer molding. Otherwise, the electrolyte within the battery will evaporate and the battery charge will be destroyed. An example of a suitable battery 32 is a lithium-carbon monofluoride cell which can be obtained from Rayovac Corporation, Part No. BR 1225 UHT. That Rayovac cell is rated at 3.2 volt DC and 35 mAh, has a 70 degree C. shelf life of 10 years, and can survive elevated temperature conditions of 225 degrees C. for three to five minutes without failure, which is more than adequate for the transfer molding procedure contemplated herein. The battery 32 has a positive terminal 32P and a negative terminal 32N which are insulated with respect to each other by an annular layer of dielectric insulation 32Q.

The semiconductor chip 12 is bonded and electrically connected to the negative battery terminal 32N by a conductive deposit of silver-filled epoxy adhesive such as Amicon CT-5047-2. The input/output nodes 14 are electrically connected to selected ones of the conductive fingers 18 by fine gold wires 34 having a diameter of 1.3 mil. Bonding of the gold wires 34 to the conductive fingers 18 and I/O nodes 14 is preferably by the conventional thermosonic ball bonding technique.

The positive terminal 32P of the backup battery 32 is electrically attached to the tie bar segments 28A, 28B prior to encapsulation, preferably by resistance welding or by soldering. As can be seen in FIG. 2, the tie bar segments 28A, 28B are separated by a longitudinal gap, with the positive terminal 32P engaging both tie bar segments, and being centered about the gap. It should be understood that the longitudinal gap between the ends of the tie bars 28A, 28B is not essential, and that the gap is an incidental result of severing the base support finger lead 28 and thereafter forming the offset tie bar segments 28A, 28B.

The vertical offset A of the tie bar segments 28A, 28B permits the backup battery 32 and integrated circuit chip 12 to be centered vertically and longitudinally within the interconnect region 22. Moreover, this arrangement also permits encapsulation of the finger lead assembly, the backup battery, chip and the gold wires 34 completely within the molded body 30. It should be understood, however, that the lead frame material 20 can be selected to have a sufficient ductility so that the tie bar segments 28A, 28B can be integrally formed in a continuous finger lead strip which is vertically offset with respect to the finger leads 18 and base support finger lead 28.

After the battery 32 has been electrically attached to the tie bar segments 28A, 28B, the integrated circuit chip 12 is bonded to the negative battery terminal 32N. The ends of the fine gold wires 34 are then connected between the chip I/O nodes 14 and the respective finger leads 18. A gold wire 34P is bonded between the positive base plate finger lead 28 and the positive backup voltage node 14P of chip 12. The appropriate negative backup voltage node 14N is electrically connected to the negative battery terminal 32N by a gold wire 34N.

The lead frame assembly 20 is then placed in a multicavity split mold. The mold cavity is closed in a transfer molding machine and a non-conductive encapsulant material such as polyphenolene sulfide is injected in fine pellet form from a nozzle. The pressure at which this injection takes place is closely controlled to prevent damage to the gold wire bonds. Under the appropriate pressure and temperature, the pellets melt and flow into channels within the mold and fill the cavities around the lead frame assembly 20, thereby completely encapsulating the lead frame 20, backup battery 32, IC chip 12 and gold wires 34. The resin is cured while still in the mold by the applied heat and pressure. Further curing takes place in an oven.

As a result of the foregoing transfer mold procedure, the package 10 is produced in the form of an elongate, generally rectangular molded body 30 of non-conductive material. After removal from the mold, the linking segments 20L between adjacent pins 16 in the lead frame assembly 20 are cut to separate and electrically isolate the pins and conductive finger leads from one another. Additionally, the transport side rails 24, 26 are also cut and separated from the molded assembly.

The lead frame 20 material preferably comprises a conventional metal alloy, such as a tin-plated nickel or iron alloy or, alternatively, a tin-plated copper alloy such as CDA 194. It will be appreciated that during assembly, the connector pins and inner conductive leads are structurally interconnected by the linking segments 20L and by the side transport side rails 24, 26, preferably stamped from a continuous metal strip. The connecting sections remain attached to the connector pins for handling purposes only and are severed prior to ultimate use.

It will be understood that a selected one of the external pins 16 is adapted for connection to a primary power supply node which provides a voltage $V_{cc}$ which is typically at +5.0 volts DC. Similarly, another external connector pin is adapted for connection to a ground node of a host electronic system for providing a ground-reference GND. Other pins are dedicated for true and complement chip select signals, CS and $\overline{CS}$, a signal CLK for synchronously clocking data to and from the integrated circuit 12, as well as various other I/O signals which are produced by the host electronic circuit. A comparator and switching circuit (not illustrated) compares the voltage $V_{cc}$ from the primary power supply of the host electronic circuit with the voltage of the backup battery 32 and automatically connects the highest detected voltage to power the integrated circuit 12.

Figure 4:
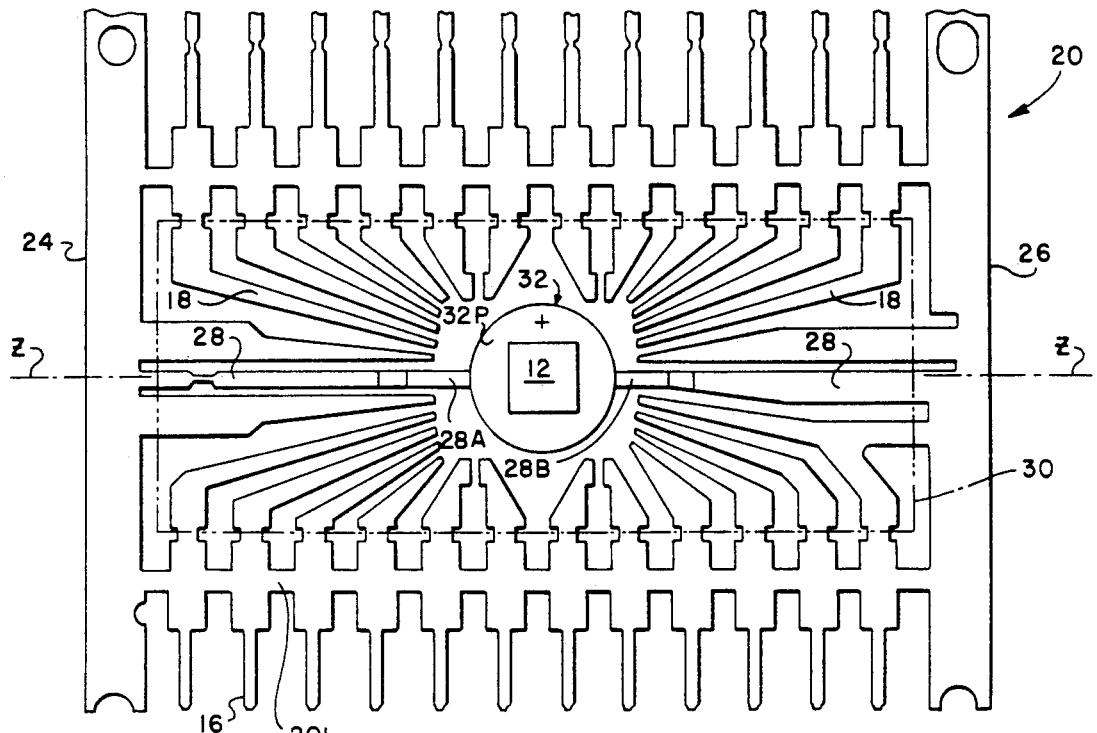
FIG. 4 is a plan view of a lead frame assembly having an integrated circuit chip mounted onto the positive terminal of a backup battery.
Figure 5:
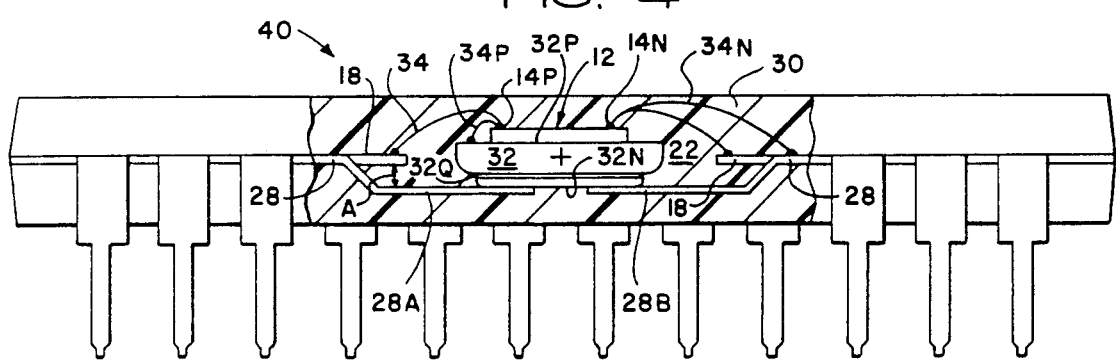
FIG. 5 is a side elevational view, partly in section, of a lead frame assembly, backup battery and integrated circuit chip of FIG. 4 encapsulated within a unitary molded package.
Figure 6:
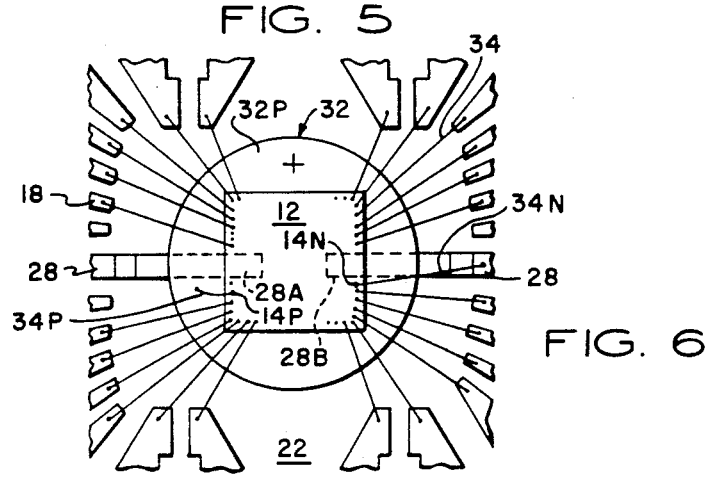
FIG. 6 is a top plan view, partially broken away, of the integrated circuit package of FIG. 5.
Figure 7:
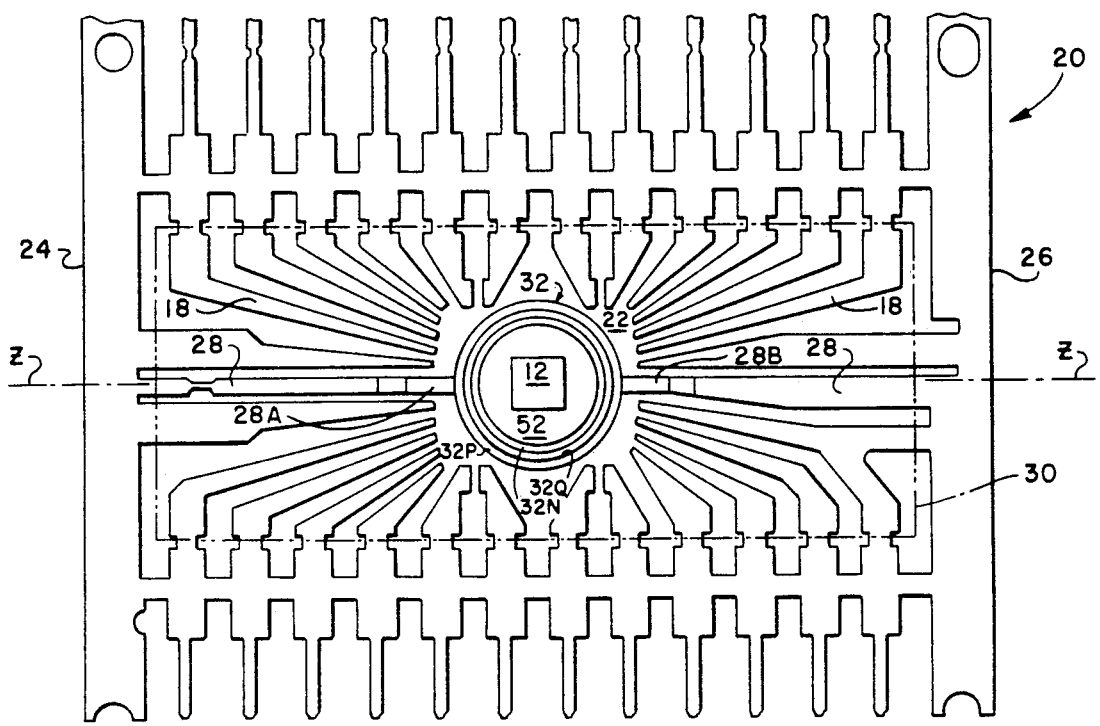
FIG. 7 is a top plan view of a semiconductor chip and backup battery mounted onto a lead frame assembly according to an alternative embodiment of the invention.
Figure 8:
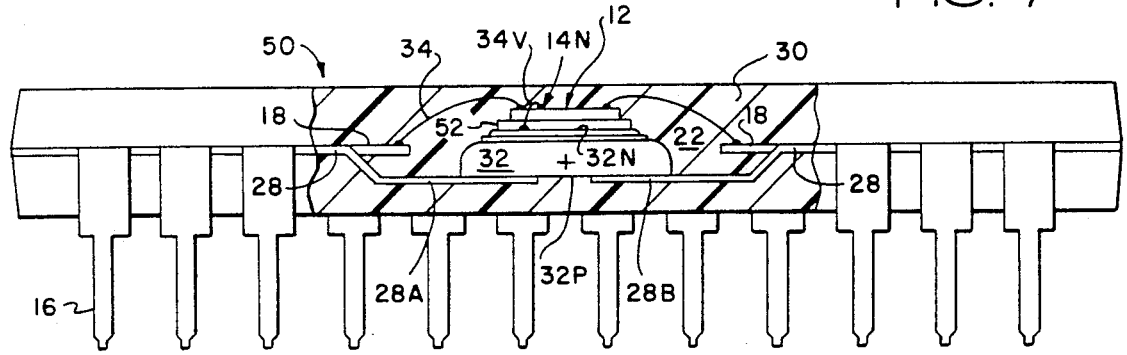
FIG. 8 is a side elevational view, partly in section, of an integrated circuit package having a backup battery, ceramic substrate and integrated circuit chip mounted onto the finger lead assembly of FIG. 7 and encapsulated within a unitary molded package.
Figure 9:
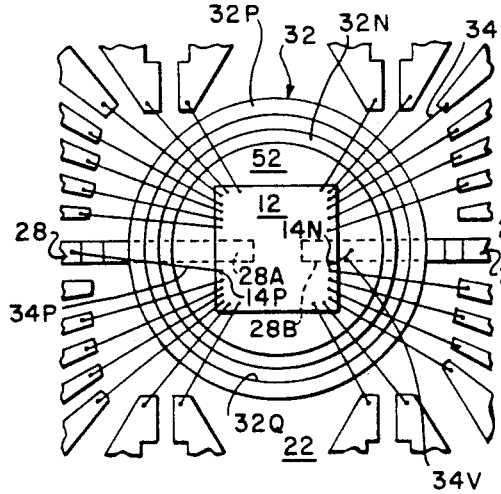
FIG. 9 is an enlarged top plan view, partially broken away, of the integrated circuit chip, ceramic substrate, backup battery and modified finger lead assembly of FIG. 8.
Figure 10:
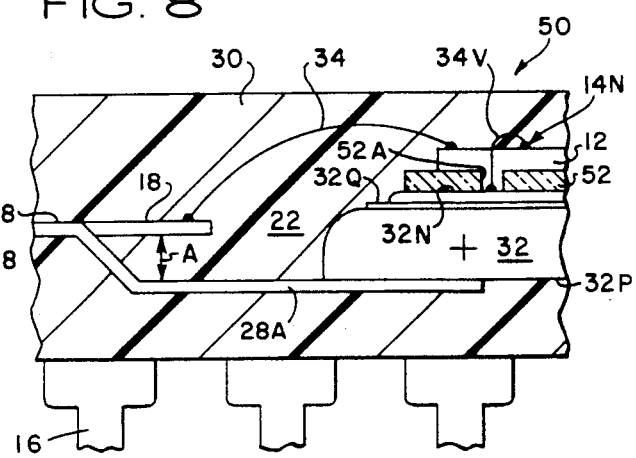
FIG. 10 is an enlarged sectional view of a portion of the unitary molded circuit package of FIG. 8.

Referring now to FIG. 4, FIG. 5 and FIG. 6, according to an alternative embodiment of the invention, a semiconductor chip package 40 supports and encapsulates the integrated circuit chip 12 and the backup battery 32, with the IC chip 12 being mounted onto the positive terminal surface 32P of the backup battery 32. A gold wire 34N is electrically connected between the base support finger lead 28 and the negative backup voltage node 14N, and a gold wire 34P is bonded between the positive backup voltage node 14P of chip 12 and the positive battery terminal surface 32P as shown in FIG. 6. The negative terminal 32N of the backup battery is electrically connected to the offset tie bar segments 28A, 28B by resistance welds. Except for inversion of the battery 32, the chip package 40 is essentially the same as the package 10 illustrated in FIGS. 1-3.

The integrated circuit chip 12 is electrically bonded to the positive battery terminal 32P by a conductive adhesive, for example a deposit of silver-filled epoxy adhesive such as Amicon CT-5047-2. Because of the vertical offset A, the stacked combination of the backup battery 32 and integrated circuit chip 12 is centered vertically and longitudinally within the interconnect region 22. According to this arrangement, the finger lead assembly, the backup battery, chip and gold wires are completely encapsulated within the body of the molded body 30. It will be apparent, therefore, that the chip package 40 differs from the chip package 10 only in that the battery 32 is inverted with respect to the battery orientation of FIG. 2, and that the package standoff height is the same.

Referring now to FIG. 7, FIG. 8, FIG. 9 and FIG. 10, yet another alternative embodiment of the invention is provided by a semiconductor chip package 50 in which the backup battery 32 is electrically bonded to the tie bar segments 28A, 28B by resistance welds, and the integrated circuit chip 12 is mechanically mounted onto the negative battery terminal 32N by a ceramic coupling substrate 52. In this arrangement, the integrated circuit chip 12 is attached to the ceramic coupling substrate 52 by deposit of conductive epoxy adhesive. The ceramic coupling substrate 52 is bonded to the negative battery terminal 32N by a layer of non-conductive epoxy adhesive. The negative power node 14N on the chip 12 is electrically connected to the negative battery terminal 32N by a via conductor 34V, as illustrated in the enlarged view of FIG. 10. The via conductor 34V is extended through an aperture 52A which intersects the coupling substrate 52.

The purpose of the ceramic coupling substrate 52 is to provide a stable, uniform support surface for the integrated circuit chip 12. Typically, the battery terminal surfaces 32P, 32N are rough and uneven, with the result that uniform seating against the battery surface is difficult to achieve. A smooth, large area contact between the integrated circuit chip and the support surface is needed to avoid the effects of mechanical stress induced into the semiconductor chip which might damage the LSI circuitry. Additionally, the ceramic substrate 52 should present a bonding surface area which is large enough to provide mechanical coupling for different IC chip sizes. For example, it may be desirable to couple an integrated circuit chip having a coupling surface area larger than the surface area of the negative battery terminal 32N. It will be apparent, therefore, that the chip package 50 differs from the chip package 10 in that the ceramic substrate 52 is interposed between the IC chip 12 and the negative battery terminal 32. The total stacked height of the battery, ceramic substrate and chip 12 remains small enough to be completely encapsulated within the molded body 30.

Figure 11:
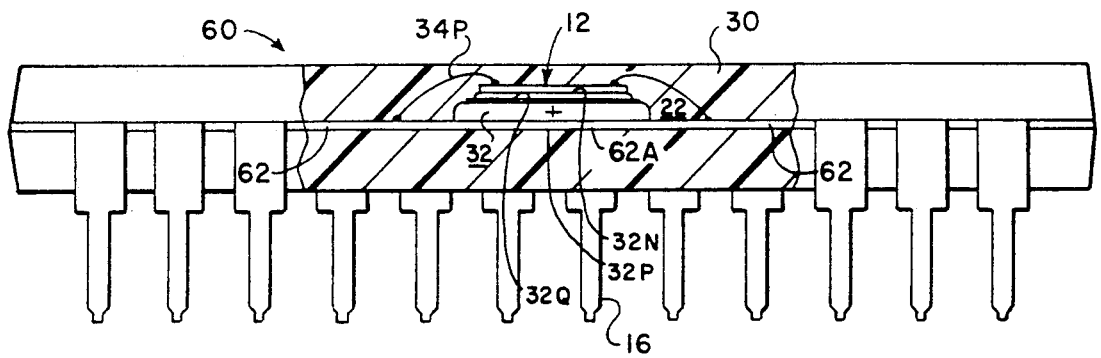
FIG. 11 is a side elevational view, partly in section, of a semiconductor integrated circuit with battery and integrated circuit being supported by a straight lead frame and encapsulated in a unitary molded package.
Figure 12:
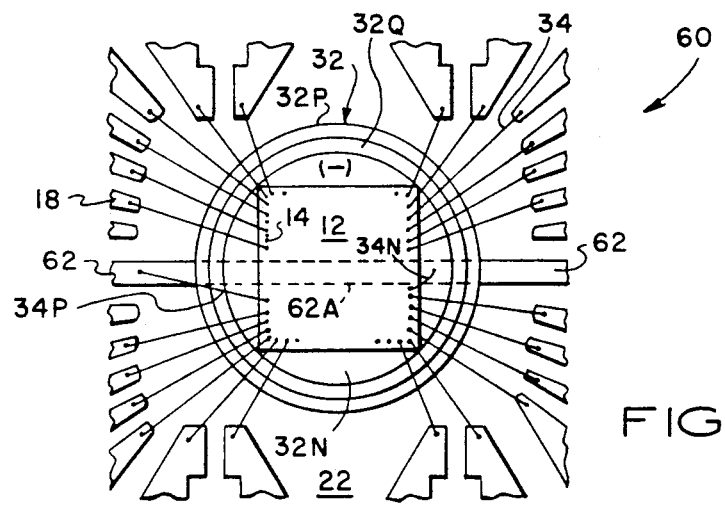
FIG. 12 is a top plan view, partially broken away, of the integrated circuit, backup battery and finger lead assembly of FIG. 11.

Referring now to FIG. 11 and FIG. 12, a semiconductor chip package 60 supports and encapsulates the integrated circuit chip 12 with the positive terminal 32P of the backup battery 32 being mounted onto a base plate support segment 62A of a base plate finger lead 62. The base plate finger lead 62 and support segment 62A are coplanar with the finger leads 18 and traverse the interconnect region 22. The advantage of this coplanar configuration is that thermosonic wire bonding can be accomplished with less difficulty as compared with the offset lead frame assembly shown in FIG. 2 and FIG. 5. A limitation on the use of the straight, coplanar base plate finger lead 62 is that it produces a slightly thicker encapsulation package 30. Otherwise, the semiconductor chip package 60 is constructed identically to the chip package shown in FIG. 2.

Figure 13:
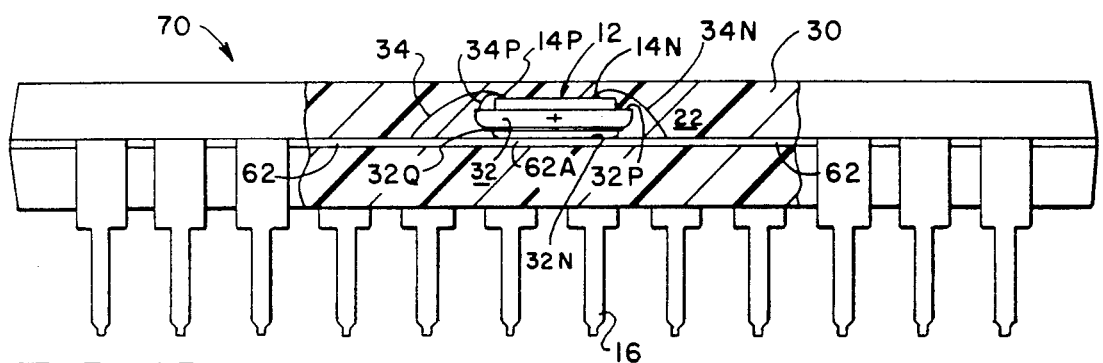
FIG. 13 is a view similar to FIG. 11, in which the negative terminal of a battery is mounted on the straight lead frame, with the integrated circuit chip being mounted on the positive terminal of the battery.
Figure 14:
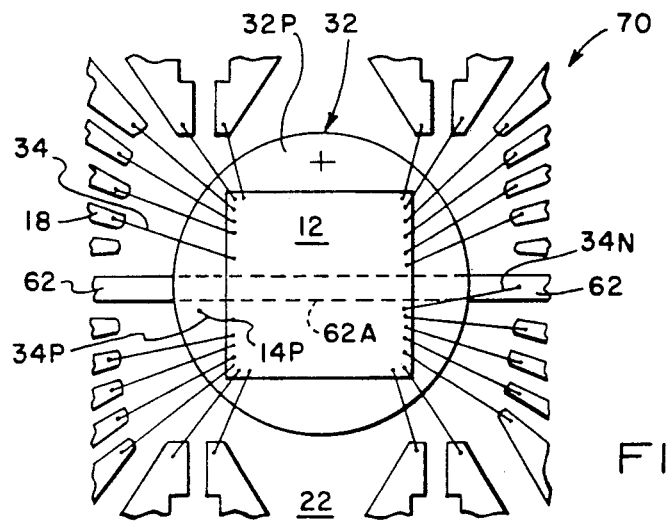
FIG. 14 is a top plan view of the integrated circuit, backup battery and finger lead assembly of FIG. 13.

FIG. 13 and FIG. 14 illustrate another mounting arrangement in which the negative terminal 32N of the battery 32 is mounted onto the base plate support segment 62A of the straight, coplanar base plate finger lead 62. The construction of the chip package 70 is identical to the construction of the chip package 60 shown in FIG. 11, except that in FIG. 13, the battery 32 is inverted with respect to the battery 32 shown in FIG. 11.

Yet another embodiment of the invention is shown in FIG. 15, FIG. 16, FIG. 17 and FIG. 18 in which a surface mount, dual-in-line molded package 80 is illustrated. In this arrangement, the battery 32 is mounted onto the offset base plate finger lead segments 28A, 28B. Although only finger lead segment 28B is shown in the sectional view of FIG. 18, it should be understood that the battery 32 is mounted on both finger lead segments in the same manner as shown in FIG. 2. The gold wires 34 are bonded by thermosonic weld bonds onto the corresponding finger leads 18, in the same manner as illustrated in FIG. 3. In the surface mount assembly 80, the conductive fingers 18 are integrally formed with external J-leads 82 which are preferably of the free-standing, compliant type which have an end portion 82A which is curled under the molded body 30 and is received within a pocket 84. The J-lead 82 also includes a rounded portion 82B which engages a solder land 86.

The solder lands 86 are bonded to the surface of an insulating substrate 88. The substrate 88 preferably has a high glass transition temperature ($T_G$), for example G-30 polyamide, and which have good laminate compliancy, for example as provided by Kevlar ® epoxy or Kevlar ® polyamide fiber.

The solder lands 86 are carefully aligned in a parallel, spaced pattern for surface contact by the curved portions of the J-leads 82. The J-leads 82 are each precoated with solder. A solder joint is then formed at each J-lead/land interface by a batch soldering process, for example the dual-wave reflow soldering technique. During the reflow soldering process, the surface mount package 80 will be exposed to thermal radiation from the solder bath, which may be at or near 363 degrees F., for example the melting point of eutectic SN 63-Pb 36 solder. Heat is transferred to the molded polymer package body 30 by conduction through the J-leads and finger leads, and also by thermal radiation from the solder bath. Consequently, the battery 32 will be subjected to high temperature levels during the reflow process.

According to an important feature of the surface mount embodiment, radiant heat transfer from the solder bath is reflected away from the molded body 30 by a thermally reflective metal layer 90, for example aluminum, copper or nickel. The reflective layer 90 is preferably a thin leaf or foil of polished aluminum which is bonded by an adhesive to the surface mount underside surface 30A of the molded package body 30. Alternatively, the reflective layer 90 is a thin coating of reflective metal particles mixed with an organic bonding material, for example, the 90-8 TM reflector coating produced by Bausch & Lomb Incorporated.

Although the invention has been described with reference to certain specific embodiments, and with reference to a package which encapsulates and provides backup battery power for an integrated circuit device, the foregoing description is not intended to be construed in a limiting sense. Various modifications of the disclosed premolded battery package as well as alternative applications thereof will be suggested to persons skilled in the art by the foregoing specification and illustrations. It is therefore contemplated that the appended claims will cover any such modifications or embodiments that fall within the true scope of the invention.

What is claimed is:

1. A device package for providing electrical power to an electronic circuit device comprising, in combination:
   a body of non-conductive material;
   a finger lead assembly encapsulated within said body of non-conductive material, said finger lead assembly including a plurality of conductive finger leads, with one of said finger leads defining a power lead;
   a battery having a positive polarity power terminal and a negative polarity power terminal, one of said battery power terminals being mounted onto said power lead;
   wherein said power lead is offset in non-coplanar relation to said finger lead assembly, and wherein said battery is mounted on said offset power lead; and,
   an electronic circuit device encapsulated within said body of non-conductive material and mounted onto said other battery power terminal.

2. A device package as defined in claim 1, wherein said power lead comprises first and second tie bar segments which are separated by a longitudinal gap, said battery being mounted on at least one of said tie bar segments.

3. A device package as defined in claim 1, wherein said conductive finger leads are spaced about an interconnect region and said power lead includes an offset base support segment which traverses said interconnect region, and one of said battery terminals is mounted on and electrically connected to said base support segment.

4. A device package as defined in claim 1, wherein said electronic circuit device is an integrated circuit implemented on a semiconductor chip, said chip being mechanically mounted upon and electrically connected to said other battery terminal in stacked relation therewith, said integrated circuit having a plurality of input/output nodes and a plurality of wire conductors connecting said input/output nodes to said conductive finger leads, and having positive and negative power nodes electrically connected by said wire conductors to said offset base support segment and to the battery terminal on which said chip is mounted, respectively.

5. A device package as defined in claim 1, wherein said battery includes positive and negative contact terminals, said negative contact terminal being mounted on and electrically connected to said offset power lead.

6. A device package as defined in claim 1, wherein said battery includes positive and negative contact terminals, said positive contact terminal being mounted on and electrically connected to said offset power lead.

7. A device package as defined in claim 1, including:
   a non-conductive coupling substrate interposed between said chip and said other battery power terminal.

8. A device package as defined in claim 7, wherein said coupling substrate is intersected by a via aperture, and said electronic circuit device is an integrated circuit implemented on a semiconductor chip, said chip being mounted upon said coupling substrate in stacked relation therewith, said integrated circuit device having a plurality of input/output nodes and a plurality of wire conductors connecting said input/output nodes to said conductive finger leads, and having positive and negative power nodes electrically connected by said wire conductors to said offset power lead and to the battery terminal on which said coupling substrate is mounted, respectively, with one of said wire conductors being extended from said integrated circuit device through said via aperture to the battery terminal on which said coupling substrate is mounted.

9. A device package as defined in claim 1, wherein said battery is hermetically sealed.

10. In an electronic circuit package of the type having a circuit device including multiple input/output nodes encapsulated within a body of non-conductive material, a plurality of connector leads mounted onto said body of non-conductive material and projecting externally thereof, and a finger lead assembly including a plurality of conductive finger leads encapsulated within said body of non-conductive material and electrically connecting said input/output nodes to said connector leads, the improvement comprising:
   a plurality of said conductive finger leads having internal end portions spaced about an interconnect region;
   one of said conductive finger leads defining a power lead and having a base support segment traversing said interconnect region, said base support segment being offset in non-coplanar relation to said finger lead assembly; and,
   a battery having positive and negative polarity terminals, one of said power terminals being mounted on and electrically connected to the base support segment of said power lead, and said circuit device being mounted on the other battery power terminal.

* * * * *